US006827828B2

(12) United States Patent
Wang

(10) Patent No.: US 6,827,828 B2
(45) Date of Patent: Dec. 7, 2004

(54) MIXED METAL MATERIALS

(75) Inventor: Guangxin Wang, Wexford, PA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/822,037

(22) Filed: Mar. 29, 2001

(65) Prior Publication Data

US 2002/0139667 A1 Oct. 3, 2002

(51) Int. Cl.[7] ......................... C22C 14/00; C22C 16/00; C22C 27/02; C23C 14/14

(52) U.S. Cl. .................. 204/298.13; 148/421; 148/422

(58) Field of Search ................................ 148/421, 422; 420/552, 417, 422, 427; 204/298.13

(56) References Cited

U.S. PATENT DOCUMENTS

| | | | | |
|---|---|---|---|---|
| 3,791,852 A | * | 2/1974 | Bunshah | 427/567 |
| 3,979,275 A | | 9/1976 | Harvey et al. | |
| 4,033,839 A | | 7/1977 | Harvey et al. | |
| 4,400,247 A | | 8/1983 | Ginatta | |
| 4,595,413 A | * | 6/1986 | Hard et al. | 420/417 |
| 4,793,854 A | | 12/1988 | Shimotori et al. | |
| 4,891,066 A | | 1/1990 | Shimotori et al. | |
| 5,059,297 A | * | 10/1991 | Hirao et al. | 204/290.8 |
| 5,204,057 A | | 4/1993 | Ishigami et al. | |
| RE34,598 E | | 5/1994 | Shimotori et al. | |
| 5,403,458 A | * | 4/1995 | Hartig et al. | 204/192.15 |
| 5,584,906 A | | 12/1996 | Ishigami et al. | |
| 5,976,641 A | * | 11/1999 | Onishi et al. | 428/1.3 |
| 6,024,847 A | | 2/2000 | Rosenberg et al. | |
| 6,056,857 A | * | 5/2000 | Hunt et al. | 204/192.15 |
| 6,309,529 B1 | | 10/2001 | Hara et al. | |

FOREIGN PATENT DOCUMENTS

| | | | | |
|---|---|---|---|---|
| EP | 0 603 486 A2 | * | 6/1994 | C23C/14/02 |
| JP | 59-116341 A | * | 7/1984 | C22C/14/00 |
| JP | 63-166797 A | * | 7/1988 | C30B/29/04 |
| JP | 01-290766 A | * | 11/1989 | C23C/14/34 |
| JP | 03-142883 A | * | 6/1991 | H01L/29/46 |
| JP | 04-182950 A | * | 6/1992 | G11B/11/10 |

OTHER PUBLICATIONS

Oohashi et al, "Composition and Structure of Co–Sputtered Ta–Ti Alloy Thin Films", 1972, from Japanese Journal of Applied Physics, vol. 11, pp. 108–109.*

Eck et al, "Properties and production of powder–metallurgical PVD–sources", Mar. 1985, from Erzmetall, vol. 38, No. 3, pp. 129–133.*

Bugliosi et al, "Performance Evaluation of Innovative PVD Coatings for Different Complex–Shaped HSS Cutting Tools", 1995, from Advances in Inorganic Films and Coatings, pp. 573–581.*

Heikinheimo et al, "High Temperature Bonding of Alumina based CMC to Metals", 1998, from DVS–Berichte 192, pp. 301–304.*

Ludtke et al, "Electron–Beam Physical Vapor Deposition of Microlaminate Composites", Mar. 1999, from EPD Congress, 1999, pub by The Minerals, Metals and Materials Society, pp. 147–155.*

"Electrochemical Reduction of Tantalum in Molten NaC1–$K_2TaF_7$"; Transactions of Nfsoc; vol. 2, No. 3; Li, Guoxun; Barhoun, A.; Lantelme, F. ; Chemia, M.; pp. 64–68.

* cited by examiner

*Primary Examiner*—Roy King
*Assistant Examiner*—Harry D. Wilkins, III
(74) *Attorney, Agent, or Firm*—Wells St. John P.S.

(57) ABSTRACT

The invention includes a method of forming a material which comprises at least two elements. More specifically, the method comprises providing an electrolytic cell comprising a cathode, an anode, and an electrolytic solution extending between the cathode and anode. A metallic product is electrolytically formed within the electrolytic cell. The forming of the metallic product comprises primarily electrorefining of a first element of the at least two elements and primarily electrowinning of a second element of the at least two elements. The invention also includes a mixed metal product comprising at least two elements, such as a product comprising tantalum and titanium.

24 Claims, 2 Drawing Sheets

MIXED METAL MATERIALS

TECHNICAL FIELD

The invention pertains to methods of electrolytically forming materials comprising at least two elements, and in particular applications pertains to methods of forming materials comprising tantalum and titanium. The invention also pertains to mixed metal materials, such as materials comprising tantalum and titanium. In addition, the invention pertains to sputtering targets made of mixed metal materials, such as targets comprising tantalum and titanium.

BACKGROUND OF THE INVENTION

Numerous applications exist in which it can be desired to form materials comprising two or more elements provided in a substantially homogenous distribution of the elements. For instance, it can be desired to form physical vapor deposition (PVD) targets comprising two or more metallic elements uniformly distributed throughout the targets. Frequently, it is difficult to combine two or more elements into a homogenous mixture when their melting points and/or densities are far apart. For example, there could be an interest to develop an alloyed titanium-tantalum target. However, making an alloyed titanium-tantalum ingot is impractical with conventional techniques. A large difference between the melting points of titanium and tantalum (1670° C. for titanium and 2996° C. for tantalum) makes it impractical to melt titanium together with tantalum in an e-beam furnace. Titanium would be simply vaporized at the melting point of tantalum. In addition, the large difference in densities (4.5 g/cm$^3$ for titanium and 16 g/cm$^3$ for tantalum) would be troublesome when powder processing an alloy comprising both titanium and tantalum. Segregation could too easily take place. Additionally, because of a generally higher gas content, powder processed targets are less preferred than melted and wrought targets.

It would be desirable to develop new methods for forming mixed metal alloy ingots, and it would be particularly desirable to develop methods which could be utilized to form titanium and tantalum alloy ingots. More generally, it would be desirable to develop new methods for forming products comprising mixtures of two or more elements. It is known that if an alloyed feedstock is melted, the melting point of the feedstock is between the melting points of components. Specifically, if an alloyed titanium and tantalum piece were melted, it would melt at a temperature in between the melting points of titanium and tantalum. The higher the portion of titanium in the piece, the lower would be the melting temperature. The lowering of the melting temperature could make the melting process much easier than for a material comprising pure tantalum. Therefore, it could be desirable to develop new methods for preparing tantalum materials diluted with titanium to form alloyed tantalum feedstocks for melting processes.

SUMMARY OF THE INVENTION

In one aspect, the invention encompasses a method of forming a material which comprises at least two elements. More specifically, the method comprises providing an electrolytic cell comprising a cathode, an anode, and an electrolytic solution extending between the cathode and anode. A metallic product is electrolytically formed within the electrolytic cell. The forming of the metallic product comprises primarily electrorefining of a first element of the at least two elements and primarily electrowinning of a second element of the at least two elements.

In another aspect, the invention encompasses a method for electrolytically forming a material, wherein an electrolytic cell is provided which comprises a cathode, at least two anodes, and an electrolytic solution extending between the cathode and the at least two anodes. The at least two anodes comprise first and second anodes having different concentrations of a first element relative to another. The electrolytic solution comprises a compound which includes a second element. A metallic product is electrolytically formed with the electrolytic cell. The metallic product comprises a mixture of the first and second elements.

In yet another aspect, the invention encompasses a method for electrolytically forming a product which comprises a mixture of tantalum and titanium.

In yet another aspect, the invention encompasses a mixed metal product comprising at least two elements, such as a product comprising tantalum and titanium. The product comprising a mixture of the at least two elements can be considered an alloyed product, and can be used as feedstock for melting processes. In particular, a product comprising titanium and tantalum can be melted in an e-beam furnace to form a titanium-tantalum alloy ingot for further processing into a sputtering target.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

In one aspect, the invention encompasses a method of forming a mixed-metal product by electrolysis wherein one metal of mixed-metal product is formed by electrorefining and another metal of the product is formed by electrowinning. For purposes of interpreting this disclosure and the claims that follow, the term "electrorefining" is defined to refer to a process in which a metal is transferred from an anode of an electrolytic apparatus to a cathode. Accordingly, electrorefining encompasses dissolution of a metal at an anode and deposition of the same metal at a cathode. In contrast, the term "electrowinning" is defined as a process wherein metal is transferred from electrolyte to a cathode. Accordingly, an electrowinning process does not require dissolution of a metal from an anodic material.

Figure 1:
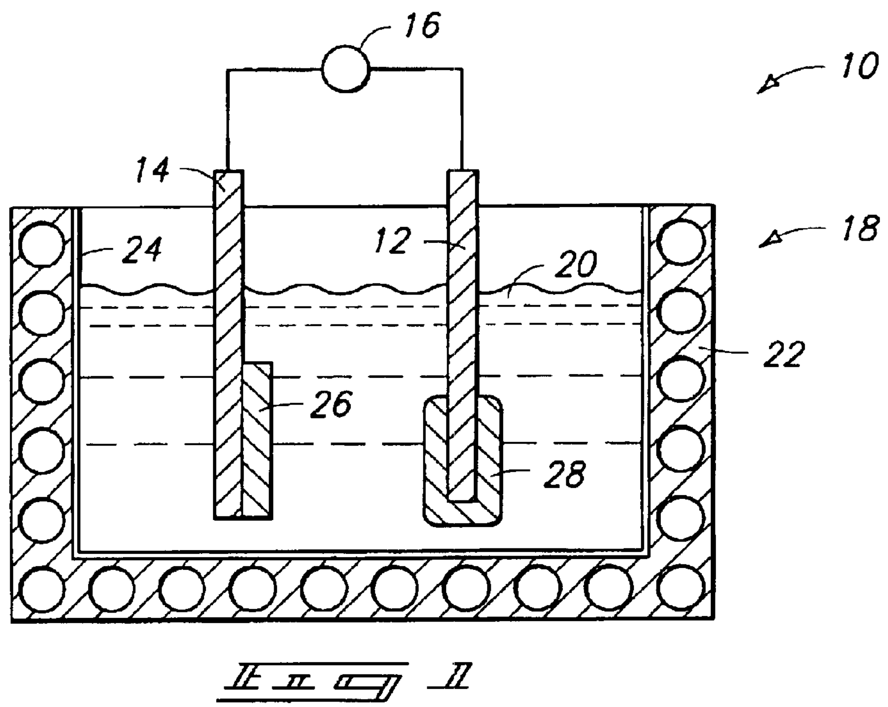
FIG. 1 is a diagrammatic, cross-sectional view of an apparatus which can be utilized for methodology of the present invention.

A process of the present invention is described with reference to FIG. 1. Specifically, FIG. 1 illustrates an exemplary electrolytic cell 10 comprising a cathode 12 and anode 14 which are electrically connected through a power source (not shown) to provide a potential difference 16 (i.e., a voltage) between the anode and cathode. Electrolytic cell 10 further comprises a vessel 18 which retains an electrolyte solution 20 therein. Vessel 18 comprises a furnace 22 and a liner 24 on an interior surface of furnace 22. Liner 24 can comprise, for example, graphite. Furnace 22 is utilized to maintain electrolytic solution 20 above a melting temperature of the solution, and further can be utilized to maintain a substantially constant temperature during an electrolytic process of the present invention. Electrolytic solution 20 extends between cathode 12 and anode 14, and accordingly completes an electrical circuit comprising cathode 12 and anode 14.

A reactant material 26 is shown joined with anode 14. Reactant material 26 can comprise a first metallic element. Although the shown embodiment has reactant material 26 provided as a discrete material relative to anode 14, it is to be understood that material 26 and anode 14 can comprise a one-piece construction, with anode 14 having a substantially homogenous composition of the first element. If the reactant material 26 is provided as a separate piece from the remainder of anode 14, reactant material 26 can be joined to the remainder of anode 14 through a conductive interface, such as, for example, through a conductive epoxy, or a welded, brazed, or solid-diffused joint. In alternative embodiments, the anode 14 can have a cupped shape, and material 26 can be retained within the cupped shape. For instance, anode 14 can be configured as a basket. In other embodiments, liner 24 can be utilized as the anode, and material 26 can be provided on the bottom of vessel 18 and lying in electrical connection with liner 24. As long as material 26 is in electrical connection with the remainder of an anodic material, material 26 can be considered as being part of an anode during an electrolytic operation. Accordingly, electrolytic operation will comprise consumption of material from anodic component 26 and redeposition of the material onto cathode 12. In other words, the electrolytic operation will comprise electrorefining of material from anodic component 26.

In the shown embodiment, a product 28 is illustrated being formed around a portion of cathode 12. Cathode 12 preferably comprises a material which is non-reactive with product 28, so that product 28 can be readily removed from cathode 12 after an electrolytic process. To reduce contamination in the cathode deposit, it can be preferred to use the same or a similar material as the cathode material. In particular applications, cathode 12 can comprise, for example, a titanium rod.

Although product 28 is shown formed on cathode 12 in the illustrated process, it is to be understood that the invention encompasses other embodiments wherein material 28 is formed relative to cathode 12 and then shed from the cathode. In such embodiments, material 28 can be collected on a shelf (not shown) provided beneath cathode 12, or in a basket (not shown) surrounding a portion of cathode 12.

Electrolytic solution 20 comprises an element different from the element which is electrorefined from anode 26. The element electrorefined from anode 26 can be considered a first element, and the different element in electrolytic solution 20 can be considered a second element. The second element can be provided as a compound within electrolytic solution 20, and in particular embodiments can be provided as a salt. The second element is transferred from solution 20 to product 28, and accordingly is electrowon during the electrolytic operation of apparatus 10. The first and second elements transferred to product 28 are typically metals, and accordingly product 28 can be a mixed-metal product comprising a first metal formed by an electrorefining process and a second metal formed by an electrowinning process.

The first and second metals of product 28 may not be formed entirely by the eletrorefining and electrowinning processes, respectively. If anode 26 comprises a mixture of both elements and the electrolytic process is operated at a cell voltage sufficiently large for both metals to be anodically dissolved and cathodically deposited, an amount of the second element formed within product 28 will result from an electrorefining process. Also, if there are contaminates containing the first element within electrolyte 20, an amount of the first element within product 28 will result from the electrowinning process. To account for such contributions of electrorefining and electrowinning, product 28 can be described as being formed by primarily electrorefining of the first element from anode 26 and by primarily electrowinning of the second element from electrolyte 20. In such description, the term "primarily" indicates that there may be some electrowinning of the first element and some electrorefining of the second element.

Although product 28 is described as comprising as a mixture of two elements, it is to be understood that product 28 can also comprise mixtures of more than two elements. For example, a mixture of elements can be provided in anodic component 26 so that more than one element is electrorefined and formed in product 28 with the electrowon element from electrolyte 20. Alternatively, or additionally, more than one element can be provided within electrolyte 20 to be electrowon during the electrorefining of one or more elements from anodic component 26. The mixed elements of product 28 will typically together define an alloy composition.

Processing of the present invention can be utilized to form materials 28 comprising mixtures of numerous elements. For instance, product 28 can comprise, consist of, or consist essentially of, two or more of tantalum, titanium, hafnium, zirconium and niobium. Alternatively, product 28 can comprise, consist of, or consist essentially of at least one of tantalum, titanium, hafnium, zirconium and niobium in combination with at least one of vanadium, aluminum, chromium, and nickel. In exemplary applications, product 28 can comprise a mixture of tantalum and titanium; titanium and hafnium; titanium and zirconium; titanium and vanadium; titanium and aluminum; titanium and chromium; tantalum and zirconium; tantalum and chromium; or tantalum and nickel.

In particular applications, product 28 can consist of, or consist essentially of, mixtures of titanium and other materials selected from the group consisting of one or more of hafnium, zirconium, tantalum, vanadium, aluminum, chromium, nickel, and niobium. Such product can comprise, for example, from about 5% titanium to about 95% titanium; from about 5% to about 25% titanium; from about 25% to about 50% titanium; from about 50% to about 75% titanium; or from about 75% to about 95% titanium.

In other particular applications, product 28 can consist of, or consist essentially of, mixtures of tantalum and other materials selected from the group consisting of one or more of hafnium, zirconium, titanium, vanadium, aluminum, chromium, nickel, and niobium. Such product can comprise, for example, from about 5% tantalum to about 95% tantalum; from about 5% to about 25% tantalum; from about 25% to about 50% tantalum; from about 50% to about 75% tantalum; or from about 75% to about 95% tantalum.

In yet other particular applications, product 28 can consist of, or consist essentially of, mixtures of hafnium and other materials selected from the group consisting of one or more of tantalum, zirconium, titanium, vanadium, aluminum, chromium, nickel, and niobium. Such product can comprise, for example, from about 5% hafnium to about 95% hafnium;

from about 5% to about 25% hafnium; from about 25% to about 50% hafnium; from about 50% to about 75% hafnium; or from about 75% to about 95% hafnium.

In yet other particular applications, product 28 can consist of, or consist essentially of, mixtures of zirconium and other materials selected from the group consisting of one or more of hafnium, tantalum, titanium, vanadium, aluminum, chromium, nickel, and niobium. Such product can comprise, for example, from about 5% zirconium to about 95% zirconium; from about 5% to about 25% zirconium; from about 25% to about 50% zirconium; from about 50% to about 75% zirconium; or from about 75% to about 95% zirconium.

In yet other particular applications, product 28 can consist of, or consist essentially of, mixtures of niobium and other materials selected from the group consisting of one or more of hafnium, zirconium, titanium, vanadium, aluminum, chromium, nickel, and tantalum. Such product can comprise, for example, from about 5% niobium to about 95% niobium; from about 5% to about 25% niobium; from about 25% to about 50% niobium; from about 50% to about 75% niobium; or from about 75% to about 95% niobium.

In an exemplary embodiment of the present invention, product 28 comprises a mixture of tantalum and titanium, wherein titanium is the electrorefined element and tantalum is the electrowon element. In such embodiment, titanium will be provided as an anodic material, and a tantalum-containing compound will be provided within electrolyte 20. The tantalum-containing compound can be a salt, such as, for example, $K_2TaF_7$. The titanium material of the anode can comprise relatively pure titanium, such as, for example, a material which is at least 99.9% titanium. Alternatively, the material can be a relativity impure form of titanium, and the electrolytic process can be utilized to purify the titanium during the electrorefining of the titanium and concomitant formation of titanium within product 28.

Electrolyte solution 20 is preferably maintained at a temperature of from about 600° C. to about 850° C., and more preferably from about 700° C. to about 750° C., during formation of a titanium/tantalum product 28.

A relative ratio of the first and second elements to one another within product 28 can be influenced and controlled by various parameters. For example, the concentration ratio of the first element to the second element in electrolyte 20 can alter the relative proportions of the first and second elements in product 28. Also the temperature of electrolyte 20 can influence the kinetics of various half reactions in the cell and thus alter the relative proportions of the first and second elements in product 28. Another method to control the relative ratio of the first and second elements to one another within product 28 is described below as a second embodiment with reference to FIG. 2.

Figure 2:
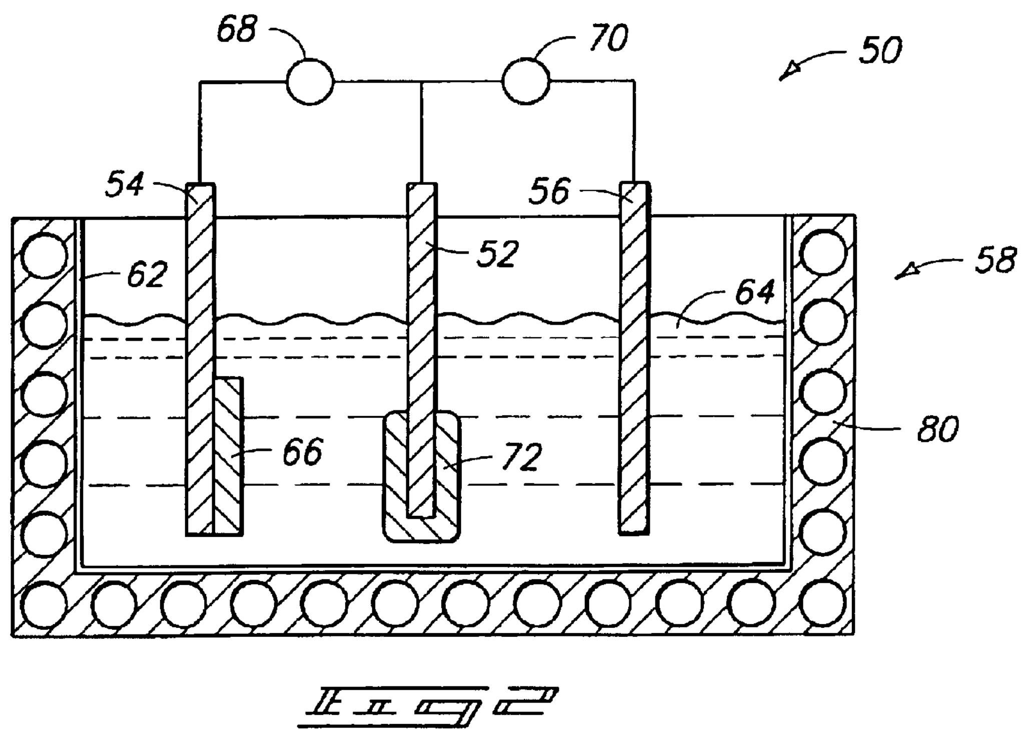
FIG. 2 is a diagrammatic, cross-sectional view of a second apparatus which can be utilized for methodology of the present invention.

FIG. 2 illustrates an apparatus 50 comprising a cathode 52 and a pair of anodes 54 and 56. Apparatus 50 further includes a vessel 58 comprising a furnace 80 and a liner 62; with an electrolyte solution 64 shown contained within vessel 58. Vessel 58 can comprise a construction identical to that described above with reference to vessel 18 of FIG. 1. Cathode 52 can comprise a construction identical to that described above with reference to cathode 12, and anode 54 can comprise a construction identical to that described above with reference to anode 14. The difference between the apparatus 50 of FIG. 2 and the apparatus 10 of FIG. 1 is that apparatus 50 comprises a second anode 56, in addition to the first anode 54. Anode 54 is coupled to cathode 52 through a first voltage (or potential) 68, and anode 56 is coupled to cathode 52 through a second voltage 70.

In the shown construction, first anode 54 is coupled with a reactant material 66 which is to be electrorefined during electrolytic operation of apparatus 50. Anode 56, in contrast, is not coupled with a reactant material. It is to be understood, however, that the invention encompasses other embodiments (not shown) wherein anode 56 is coupled with a reactant material. Preferably, in such constructions the reactant material coupled with anode 56 will have a different concentration of an element that is to be electrorefined than does the reactant material 66.

Electrolyte 64, like the electrolyte 20 of the FIG. 1 apparatus, comprises an element which is to be electrowon during electrolytic operation of apparatus 50. In an exemplary application, this element can be tantalum, and the reactant anodic material 66 can comprise titanium.

In operation, power is supplied to generate potentials 68 and 70, and such causes electrorefining of an element from anodic material 66 and electrowinning of an element form electrolyte 64. The electrowon and electrorefined elements together form a product 72. The relative concentration of the electrowon and electrorefined materials can be adjusted by adjusting voltage 68 relative to voltage 70.

In particular embodiments of the present invention, second anode 56 comprises graphite, and the first anode comprises a titanium material, such as, for example, a titanium reactant 66. (It is noted that although anodic reactant 66 is shown separately coupled to anodic component 54, the invention encompasses alternative embodiments (not shown) wherein anodic component 54 itself comprises the titanium material, and wherein the separate anodic material 66 is not utilized).

Generally, voltage 68 and voltage 70 are determined by the desired half reactions at each anode and at cathode. In an exemplary case, the desired half reaction at anode 54 is $Ti-2e=Ti^{2+}$; whereas at anode 56 a reaction of fluorine gas generation is desired: $2F^{-}-2e=F_2$. At the cathode, two reaction are desirable: $Ti^{2+}+2e=Ti$ and $Ta^{5+}+5e=Ta$. Voltage 68 and voltage 70 should be large enough to ensure that these reactions take place. The relative magnitude of voltage 68 to voltage 70 can dictate the amount of titanium transferred to product 72. Specifically, if the magnitude of voltage 68 is reduced relative to the magnitude of voltage 70, less titanium will be transferred to product 72. Accordingly, a relative concentration of tantalum in material 72 can be decreased by decreasing the magnitude of voltage 68 relative to the magnitude of voltage 70. In particular applications, the magnitude of voltage 68 relative to voltage 70 will be fixed during formation of product 72. In other applications, the magnitude of voltage 68 will be varied relative to the magnitude of voltage 70 during product formation, and such can cause a relative concentration of tantalum and titanium to be varied within product 72.

In particular embodiments, first anode 54 and second anode 56 can both comprise titanium, but at different concentrations relative to one another. In such applications, the relative concentration of titanium in material 72 can still be adjusted by adjusting the potential 68 relative to the potential 70. Specifically, if anode 54 comprises a higher concentration of titanium than anode 56, then a higher relative magnitude of potential 68 to potential 70 will result in more titanium being electrorefined in product 72 than would be electrorefined with a lower relative magnitude of potential 68 to potential 70.

In still other particular embodiments of the present invention, anode 56 will not comprise an element which is to be electrorefined, but will instead comprise, for example, carbon, and will therefore be utilized for electrowinning only. For instance, anode 56 can predominantly comprise carbon (for example, graphite), consist essentially of carbon, or consist of carbon.

Although the embodiment of FIG. 2 is described as forming a mixed metal product comprising two different elements, it is to be understood that the embodiment can be utilized for forming mixed metal products comprising more than two elements. For instance, multiple elements can be electrorefined and combined with an electrowon element to form product 72. Alternatively, multiple elements can be electrowon and combined with an electrorefined element. In yet other alternative embodiments, multiple materials can be electrorefined and combined with multiple materials which are simultaneously electrowon to form the resultant product.

Once a mixed metal product is formed (either 28 of FIG. 1 or 72 of FIG. 2, for example) the mixed metal product can be subjected to further processing to yield a material suitable for industrial applications. For instance, the mixed metal product can be melted and cast into an ingot form. Since the mixed metal product is formed by codeposition of two or more metals, it is essentially microscopically homogeneous and the deposition process can be, in fact, an alloying process. The melting point of the alloyed mixed metal product will be between the melting points of the constituent metal elements. For a mixed titanium-tantalum product, this means that it will melt below 2996° C., but above 1670° C. The actual melting temperature is dependent on the proportions of both elements. A lower melting temperature can make a melting process much easier. Accordingly, a mixed metal product of this invention comprising a titanium/tantalum alloy can be a more suitable feedstock for melting and forming tantalum-containing ingots than would be a material comprising pure tantalum or a material mixture comprising pure tantalum and pure titanium in a non-alloyed state.

The relative amount of tantalum and titanium in product 28 (or product 72), and in melted ingots formed from the product, can be adjusted so that either titanium or tantalum is the predominant material. Further product 28 or melted ingots can consist essentially of, or consist of, titanium and tantalum. Ingots can be subjected to metallurgical processing (such as, for example, hot forging, hot or cold rolling, extrusion and thermal treatments,) to adjust textures and/or grain sizes within the materials of the ingots to desired parameters. Attention should be paid to the solubility of tantalum in titanium during metallurgical processing. The solubility of tantalum in titanium at 600° C. is about 12%. It reduces during cooling, and is, for example, only about 7% at 400° C. Thus, tantalum-rich precipitates can form during cooling from a melting temperature or another higher processing temperature, when tantalum exceeds its solubility in titanium. In alloys with a low tantalum content, this is not a problem. But for higher tantalum content, say higher than 7%, the precipitation could be undesirable. A method of reducing precipitate formation is to rapidly quench the titanium/tantalum mixed metal product so that the tantalum is locked within the titanium matrix before the tantalum has an opportunity to form precipitates. The temperature and rate of the quench procedure are preferably chosen such that there is effectively no tantalum-rich precipitate present within the titanium/tantalum material after it has been quenched. A suitable fluid for quenching the titanium/tantalum material is a liquid, such as, for example, water or oil.

Another way to prevent or reduce precipitation is to apply powder metallurgy to form parts. The mixed metal product 28 or 72 is essentially free of segregation. When pressed into shapes and sintered at a suitable temperature, parts can be free of precipitates and free of segregation. Therefore, the mixed metal product 28 or 72 can be considered a better starting material for a powder process than would be a material having a higher amount of segregation between elemental constituents of the material.

The discussion above is directed toward forming titanium/tantalum materials predominately comprising titanium and having effectively no tantalum-rich precipitates therein. Methodology of the present invention can also be utilized to form titanium materials having tantalum-rich precipitates therein. Such materials can be formed if a tantalum concentration exceeds the solubility of tantalum in titanium. A suitable thermomechanical process including forging, and/or rolling, and/or extrusion, and heat treatment can be performed to control the size, the shape and the distribution of the tantalum-rich precipitates.

The thermo-mechanically processed material can be shaped into a form suitable for desired industrial applications. For instance, the material can be shaped into a PVD target, such as, for example, a sputtering target.

Figure 3:
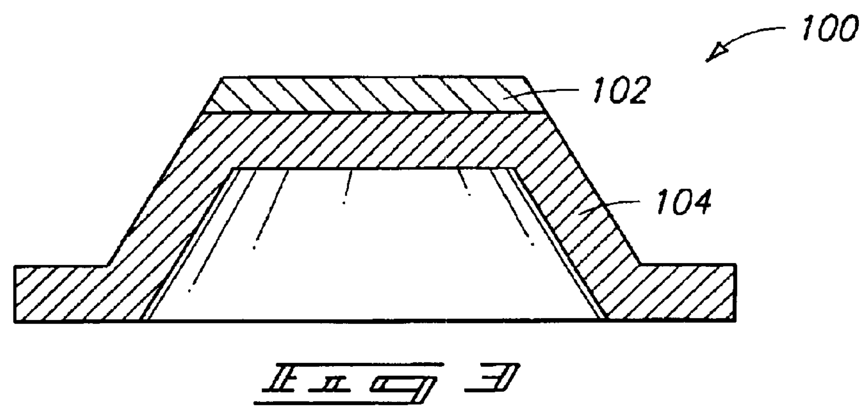
FIG. 3 is a diagrammatic, cross-sectional view of a sputtering target/backing plate structure which can be formed in accordance with methodology of the present invention.
Figure 4:
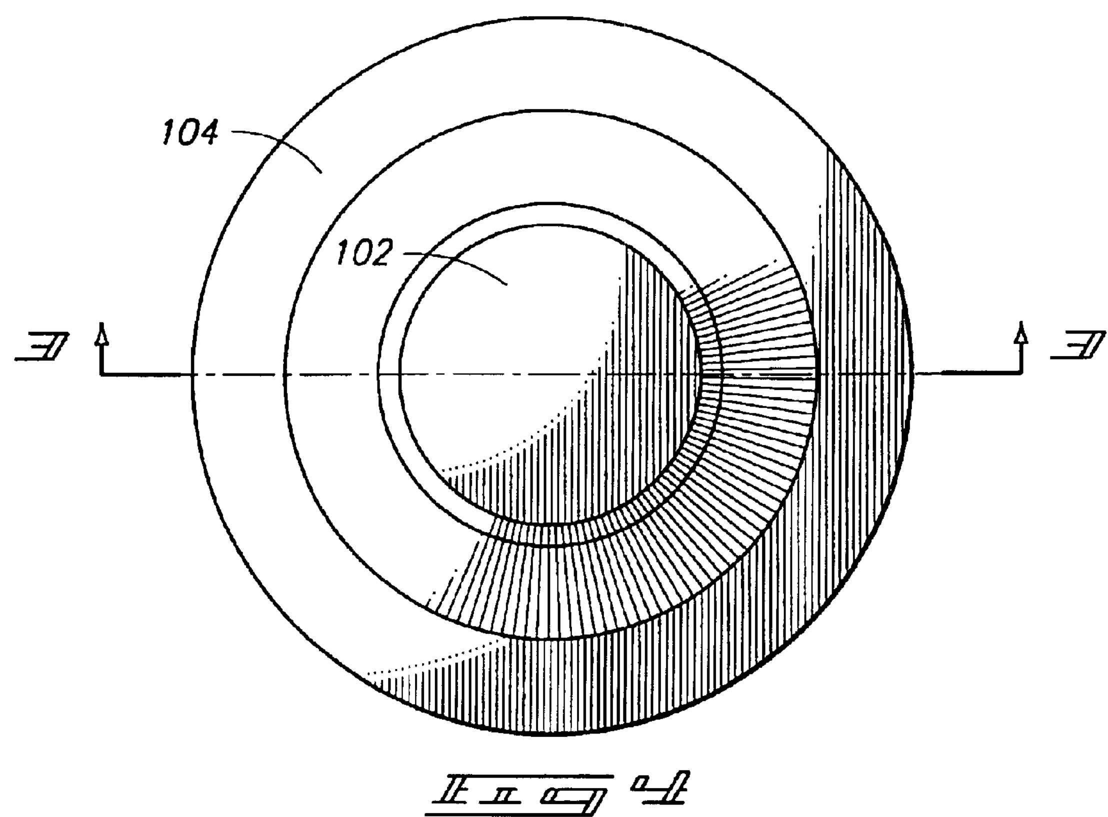
FIG. 4 is a diagrammatic top view of the structure of FIG. 3, with the cross-sectional view of FIG. 3 indicated by the line 3—3 of the figure.

FIGS. 3 and 4 illustrate exemplary embodiments of a PVD target assembly. Specifically, FIGS. 3 and 4 illustrate an assembly 100 comprising a sputtering target 102 bonded to a backing plate 104. The shown construction is an ENDURA™ construction, but it is to be understood that the invention can be utilized for forming other PVD target constructions. Further, although the shown embodiment has a sputtering target 102 bonded to a backing plate 104, it is to be understood that the invention also encompasses embodiments wherein the mixed metal target is a monolithic target. In such embodiments, the mixed metal can be formed into a target having a shape of apparatus 100, and accordingly wherein there is no backing plate 104. The mixed metal product can be formed into a target shape (such as, for example, the shape of target 102; or the shape of a monolithic target) by conventional metal-working methodology.

It can be advantageous to have a target 102 comprising a mixture of tantalum and titanium. For instance, PVD targets are frequently utilized for sputter deposition of tantalum in forming semiconductor constructions. Tantalum can be a desired barrier layer in constructions comprising copper, in that tantalum can impede copper diffusion. However, tantalum is a relatively expensive material. Accordingly, it can be desired to form targets wherein tantalum is diluted within another, less expensive, material; and then to sputter-deposit tantalum-containing films from such targets.

It can be advantageous to utilize methodology of the present invention for forming products comprising mixtures of titanium and tantalum, in that it is typically difficult to mix tantalum and titanium. Specifically, tantalum and titanium have significantly different melting points from one another (1670° C. for titanium and 2996° C. for tantalum) and significantly different densities (4.5 grams/centimeter$^3$ for titanium and 16 grams/centimeter$^3$ for tantalum). Accordingly, segregation between titanium and tantalum frequently happens during either melting or powder processing of titanium and tantalum in attempts to form mixtures of titanium and tantalum by conventional methodology. However, methodology of the present invention can form products comprising mixtures of titanium and tantalum with little or no segregation of titanium and tantalum within the products.

Exemplary targets comprising tantalum diluted in another material are targets comprising a mixture of tantalum and titanium. In particular applications, such targets can consist essentially of a mixture of tantalum and titanium, and in further applications such targets can consist of a mixture of tantalum and titanium. Further, the targets can be provided to a purity of 99.9% (3N) or higher (with the percentage being expressed in terms of weight percent; and with it being understood that percentage purities expressed herein are in terms of weight percent unless stated otherwise), with desired purities being 99.99%, 99.995%, 99.999%, 99.9995%, or higher. Such purities can be obtained by methodology of the present invention, in that electrorefining and electrowinning methodology of the present invention can be utilized as a purification step, in addition to a step involved in formation of a mixed metal product. Further, if it is desired to increase a purity of a mixed metal product, such can be accomplished utilizing conventional processes, such as, for example, e-beam melting.

In particular applications, a sputtering target of the present invention will comprise tantalum and titanium; consist of tantalum and titanium, or consist essentially of tantalum and titanium. An exemplary target can comprise tantalum and titanium present to 99.9% purity or higher, and will comprise a tantalum concentration of greater than 0% and less than 12%. The tantalum concentration can, for example, be from about 5% to about 12%; or from about 7% to about 12%. Alternatively, the target can comprise titanium to a concentration of at least about 50%, and can comprise tantalum to a concentration of less than or equal to about 50%. In other alternative embodiments, the target can comprise more than 50% tantalum, with the remainder of the target being titanium; with an exemplary PVD target consisting of tantalum and titanium, and having a tantalum concentration greater than or equal to about 5 weight percent and less than or equal to about 95 weight percent.

What is claimed is:

1. An electrolytically formed material which comprises a mixture of tantalum and titanium; and which is at least 99.9 weight percent tantalum and titanium.

2. The material of claim 1 comprising at least about 50 weight percent titanium.

3. The material of claim 1 comprising greater than a weight percent tantalum and less than or equal to about 12 weight percent tantalum.

4. The material of claim 1 comprising greater than or equal to about 7 weight percent tantalum and less than or equal to about 12 weight percent tantalum.

5. The material of claim 1 being in the shape of a PVD target.

6. A material which consists essentially of at least one first element selected from the group consisting of titanium, tantalum, zirconium, hafnium, and niobium; and at least one second element selected from the group consisting of vanadium and nickel; and wherein the material comprises the tantalum to a concentration of greater than or equal to about 5 weight percent and less than or equal to about 95 weight percent.

7. The material of claim 6 comprising the tantalum to a concentration of greater than or equal to about 5 weight percent and less than or equal to about 25 weight percent.

8. The material of claim 6 comprising the tantalum to a concentration of greater than or equal to about 25 weight percent and less than or equal to about 50 weight percent.

9. The material of claim 6 comprising the tantalum to a concentration of greater than or equal to about 50 weight percent and less than or equal to about 75 weight percent.

10. The material of claim 6 comprising the tantalum to a concentration of greater than or equal to about 75 weight percent and less than or equal to about 95 weight percent.

11. A material which consists essentially of at least one first element selected from the group consisting of titanium, tantalum, zirconium, hafnium, and niobium; end at least one second element selected from the group consisting of vanadium and nickel; and wherein the material comprises the titanium to a concentration of greater than or equal to about 5 weight percent and less than or equal to about 25 weight percent.

12. A material which consists essentially of at leant one first element selected from the group consisting of titanium, tantalum, zirconium, hafnium, and niobium; and at least one second element selected from the group consisting of vanadium and nickel; and wherein the material comprises the hafnium to a concentration of greater then or equal to about 5 weight percent and less than or equal to about 95 weight percent.

13. The material of claim 12 comprising the hafnium to a concentration of greater than or equal to about 5 weight percent and less than or equal to about 25 weight percent.

14. The material of claim 12 comprising the hafnium to a concentration of greater than or equal to about 25 weight percent and less than or equal to about 50 weight percent.

15. The material of claim 12 comprising the hafnium to a concentration of greater than or equal to about 50 weight percent and less than or equal to about 75 weight percent.

16. The material of claim 12 comprising the hafnium to a concentration of greater than or equal to about 75 weight percent and less than or equal to about 95 weight percent.

17. A material which consists essentially of at least one first element selected from the group consisting of titanium, tantalum, zirconium, hafnium, and niobium; and at least one second element selected from the group consisting of vanadium and nickel; and wherein the material comprises the niobium to a concentration of greater than or equal to about 5 weight percent and less than or equal to about 95 weight percent.

18. The material of claim 17 comprising the niobium to a concentration of greater than or equal to about 5 weight percent and less than or equal to about 28 weight percent.

19. The material of claim 17 comprising the niobium to a concentration of greater than or equal to about 25 weight percent and less than or equal to about 50 weight percent.

20. The material of claim 17 comprising the niobium to a concentration of greater than or equal to about 50 weight percent and less than or equal to about 75 weight percent.

21. The material of claim 17 comprising the niobium to a concentration of greater than or equal to about 75 weight percent and less than or equal to about 95 weight percent.

22. A material which consists essentially of at least one first element selected from the group consisting of titanium, tantalum, zirconium, hafnium, and niobium; and at least one second element selected from the group consisting of vanadium end nickel; and wherein the material comprises the zirconium to a concentration of greater than or equal to about 5 weight percent and less than or equal to about 25 weight percent.

23. The material of claim 22 being in the shape of a PVD target.

24. A PVD target which consists essentially of Hf and Cr.

* * * * *